(12) United States Patent
Swart et al.

(10) Patent No.: US 9,753,058 B2
(45) Date of Patent: Sep. 5, 2017

(54) WIRING BOARD FOR TESTING LOADED PRINTED CIRCUIT BOARD

(71) Applicant: XCERRA CORPORATION, Norwood, MA (US)

(72) Inventors: Mark A. Swart, Villa Park, CA (US); Kenneth R. Snyder, Pomona, CA (US); Stephen J. Koolis, Orange, CA (US); Douglas W. Tackett, Amarillo, TX (US)

(73) Assignee: Xcerra Corporation, Norwood, MA (US)

( * ) Notice: Subject to any disclaimer, the term of this patent is extended or adjusted under 35 U.S.C. 154(b) by 7 days.

(21) Appl. No.: 14/529,033

(22) Filed: Oct. 30, 2014

(65) Prior Publication Data

US 2015/0054539 A1 Feb. 26, 2015

Related U.S. Application Data

(63) Continuation-in-part of application No. 12/959,765, filed on Dec. 3, 2010, now Pat. No. 8,907,694.

(60) Provisional application No. 61/287,595, filed on Dec. 17, 2009.

(51) Int. Cl.
*G01R 31/20* (2006.01)
*G01R 1/073* (2006.01)
*G01R 31/28* (2006.01)
*G01R 31/319* (2006.01)

(52) U.S. Cl.
CPC ..... *G01R 1/07378* (2013.01); *G01R 31/2801* (2013.01); *G01R 31/2844* (2013.01); *G01R 31/31905* (2013.01); *Y10T 29/49126* (2015.01)

(58) Field of Classification Search
USPC ...... 324/754.07, 756.05, 754, 755, 758, 761
See application file for complete search history.

(56) References Cited

U.S. PATENT DOCUMENTS

| | | | | |
|---|---|---|---|---|
| 3,375,000 | A | * | 3/1968 | Seamands et al. ........... 267/162 |
| 3,792,412 | A | * | 2/1974 | Madden .......................... 439/82 |
| 3,830,956 | A | * | 8/1974 | Wootton et al. .............. 174/262 |
| 4,833,402 | A | | 5/1989 | Boegh-Petersen |
| 4,977,370 | A | * | 12/1990 | Andrews .................. 324/754.08 |

(Continued)

FOREIGN PATENT DOCUMENTS

| | | |
|---|---|---|
| CN | 1766649 A | 5/2006 |
| JP | 2004-93468 A | 3/2004 |

(Continued)

OTHER PUBLICATIONS

International Search Report and Written Opinion for International Application No. PCT/US2010/060868, date of mailing Feb. 22, 2011; search completed Feb. 4, 2011, 7 pages.

(Continued)

*Primary Examiner* — Giovanni Astacio-Oquendo
(74) *Attorney, Agent, or Firm* — Lewis Roca Rothgerber Christie LLP

(57) ABSTRACT

A wiring board for transmission of test signals between test point locations on a circuit board under test and an external analyzer having compliant contacts making electrical contact with a pad positioned on a conductive surface circuit layer having a trace extending to a second pad having a hole for receipt of an interface pin having a swaged head electrically connected to the external analyzer.

16 Claims, 9 Drawing Sheets

(56) References Cited

U.S. PATENT DOCUMENTS

| | | | |
|---|---|---|---|
| 5,049,813 A * | 9/1991 | Van Loan et al. ....... 324/754.14 |
| 5,270,641 A * | 12/1993 | Van Loan et al. ....... 324/754.11 |
| 5,326,936 A * | 7/1994 | Taniuchi et al. ............. 174/260 |
| 5,498,964 A | 3/1996 | Kerschner et al. |
| 5,818,248 A | 10/1998 | St. Onge |
| 5,945,836 A | 8/1999 | Sayre et al. |
| 6,043,669 A * | 3/2000 | Carroll ..................... 324/750.26 |
| 6,047,469 A | 4/2000 | Luna |
| 6,064,214 A * | 5/2000 | Self .......................... 324/754.12 |
| 6,066,957 A | 5/2000 | Van Loan et al. |
| 6,194,908 B1 | 2/2001 | Wheel et al. |
| 6,229,322 B1 * | 5/2001 | Hembree ...................... 340/584 |
| 6,255,602 B1 * | 7/2001 | Evans ................ G01R 1/07378 174/261 |
| 6,281,692 B1 | 8/2001 | Bodenweber et al. |
| 6,384,341 B1 | 5/2002 | Rothermel et al. |
| 6,414,504 B2 | 7/2002 | Johnston |
| 6,489,791 B1 | 12/2002 | Tsujii |
| 6,603,323 B1 * | 8/2003 | Miller ................ G01R 1/07378 324/754.14 |
| 6,650,134 B1 * | 11/2003 | Schein ............... G01R 1/07378 324/756.04 |
| 6,729,019 B2 * | 5/2004 | Grube ................ G01R 1/07314 29/592.1 |
| 6,784,675 B2 * | 8/2004 | Willard .................... 324/754.11 |
| 6,876,216 B2 * | 4/2005 | Fu-Chin ............. G01R 1/07378 324/754.07 |
| 6,963,209 B1 | 11/2005 | Gailus et al. |
| 6,998,864 B2 * | 2/2006 | Karavakis ............ G01R 1/0483 324/754.18 |
| 7,098,679 B2 | 8/2006 | Dick et al. |
| 7,131,047 B2 * | 10/2006 | Welbon .............. G01R 31/2808 338/307 |
| 7,132,834 B2 | 11/2006 | Tesdahl et al. |
| 7,288,954 B2 | 10/2007 | Kirby et al. |
| 7,616,019 B2 | 11/2009 | Oshetski et al. |
| 7,714,590 B2 * | 5/2010 | Jow ................... G01R 31/2818 324/537 |
| 2001/0033180 A1 * | 10/2001 | Swart ................... G01R 1/0675 324/754.03 |
| 2004/0012405 A1 * | 1/2004 | Cheng ................ G01R 1/07378 324/756.03 |
| 2004/0061825 A1 * | 4/2004 | Sugimoto et al. ............ 349/149 |
| 2008/0265933 A1 | 10/2008 | Tanioka et al. |
| 2009/0200067 A1 | 8/2009 | Nozu |
| 2009/0261465 A1 * | 10/2009 | Shinagawa ................... 257/686 |
| 2011/0148451 A1 * | 6/2011 | Swart ................ G01R 31/2844 324/756.05 |
| 2011/0175636 A1 * | 7/2011 | Swart ................ G01R 1/06722 324/755.05 |

FOREIGN PATENT DOCUMENTS

| | | |
|---|---|---|
| JP | 2005-79144 A | 3/2005 |
| JP | 2009-76873 A | 4/2009 |
| WO | WO 2004/048981 A1 | 6/2004 |
| WO | WO 2006/012529 A1 | 2/2006 |
| WO | WO 2008/070673 A2 | 6/2008 |
| WO | WO 2008/095091 A2 | 8/2008 |

OTHER PUBLICATIONS

PCT Notification with International Preliminary Report on Patentability for International Application No. PCT/US2010/060868; date of issuance Jun. 19, 2012; date of mailing Jun. 28, 2012; 9 pages.

Official letter and Search Report issued for Taiwanese Patent Application No. 99143251 dated Apr. 22, 2013 with English Translation of Search Report, 12 pages.

Chinese Office action and Search Report for parallel Chinese Application No. 201080057353.5 issued Feb. 7, 2014, citing the above listed references (with English translation), 24 pages.

Communication from the European Patent Office forwarding the Supplementary European Search Report and Opinion for Application No. 10838264.9, dated Jul. 29, 2014, 9 pages.

* cited by examiner

WIRING BOARD FOR TESTING LOADED PRINTED CIRCUIT BOARD

CROSS-REFERENCE TO RELATED APPLICATION(S)

This application is a continuation-in-part of U.S. patent application Ser. No. 12/959,765 filed Dec. 3, 2010, which claims priority to and the benefit of U.S. Provisional Application No. 61/287,595 filed Dec. 17, 2009, the entire contents of which are incorporated herein by reference.

BACKGROUND OF THE INVENTION

This invention relates to test fixtures for the automatic testing of loaded printed circuit boards, and more particularly to a wiring board test fixture design having multiple un-laminated layers that electrically connect test probes to interface probes.

Automatic test equipment for checking printed circuit boards has long involved the use of a "bed-of-nails" test fixture to which the circuit board is mounted during testing. This test fixture includes a large number of nail-like, spring loaded test probes arranged to make electrical contact under spring pressure with designated test points on the circuit board under test (UUT). Any particular circuit laid out on a printed circuit board (PCB) is likely to be different from other circuits, and consequently, the bed-of-nails arrangement for contacting test points in a particular circuit board must be customized for that circuit board. When the circuit to be tested is designed, a pattern of test points to be used in testing, it is selected and a corresponding array of test probes is configured in the test fixture. This method typically involves drilling a pattern of holes in a probe plate to match the customized array of test probes and then mounting the test probes in the drilled holes in the probe plate. The circuit board is then mounted in the fixture, superimposed on the array of test probes. During testing, the spring loaded test probes are brought into spring pressure contact with the test points on the UUT. Electrical test signals are then transferred from the board to the test probes and then to the exterior of the fixture for communication with a high speed electronic test analyzer which detects continuity or lack of continuity between various test points and the circuits on the board.

Various approaches have been used in the past for bringing the test probes and the PCB under test into pressure contact for testing loaded printed circuit boards. One class of these fixtures is a wired test fixture in which the test probes are individually wired to separate interface contacts for use in transmitting test signals from the probes to the external electronically controlled test analyzer. These wired test fixtures were dedicated fixtures are often referred to as "vacuum test fixtures" since a vacuum may be applied to the interior of the test fixture housing during testing to compress the circuit board into contact with the test probes. Customized wired test fixtures of similar construction also can be made by using mechanical means, other than vacuum, to apply the spring force necessary for compressing the board into contact with the probes during testing.

Another class of test fixtures for testing bare printed circuit boards is the so-called grid type fixture in which the test points on the test side of a board are contacted by flexible pins or tilt pins which can move or otherwise be positioned to contact the random pattern of test points on the board and transfer test signals from the board to sets of interface pins arranged in a grid pattern on the receiver. In these grid type testers, fixturing is generally less complex and simpler than the customized wired test fixtures because there is no need to individually hard wire the test probes to separate interface contacts for each differently configured circuit to be tested; but with a grid system, the grid interfaces and test electronics are substantially more complex and costly.

In a grid type fixture for bare circuit board testing, the wiring for the grid array remains constant, independent of the configuration of the particular circuit board. What does change, however, is what is referred to as the translator fixture. The translator fixture includes a bottom plate having a hole pattern corresponding to the grid pattern of openings in a standard pin grid array, and a top plate having a hole pattern corresponding to the random off-grid pattern of contact points to be tested on a printed circuit board. A number of electrically conductive translator pins (these can be flexible pins or rigid tilt pins) are mounted in the holes of the top and bottom plates. As the translator pins travel through the translator fixture, they are redirected by the hole patterns of the plates to provide individual conductive paths between the standard grid pattern and the off-grid pattern corresponding to the test points on the circuit board under test. Extreme contact accuracy can be achieved between the translator pin and the test pad on the PCB because the translator pin does not extend beyond the upper surface of the top plate. The top plate in effect can accurately direct the translator pin precisely to the test pad through the holes in the top plate. The construction of the grid type translator fixture is typically less labor intensive than the rewiring of test probes in a wired type test fixture, making it simpler to customize the fixture to accommodate PCB's with different test point patterns. Therefore, it is often desirable to use a grid type test fixture when testing printed circuit boards having various different shapes and/or configurations.

Prior loaded printed circuit board test fixtures are expensive and time consuming to manufacture, hence a need exists for a low cost alternative for testing printed circuit boards, particularly for low volume applications.

SUMMARY OF THE INVENTION

One embodiment of the invention comprises a vacuum, pneumatic or mechanical loaded circuit board test fixture having a removable wiring board for transmitting test signals between a high force spring probe pattern and a test pattern on the unit under test (UUT). The high force spring probe pattern corresponds to a probe pattern in the base of the test fixture with sufficient spacing to accommodate up to 100 mil spring force probes capable of delivering high spring force to test high density test point arrangements for loaded circuit boards. The test pattern corresponds to a high density test point arrangement on the loaded PCB under test.

The wiring board comprises a plate and one or more transfer board layers positioned on the plate. The transfer board layer includes conductive pads, corresponding to test point locations on the unit under test, which are connected to a trace. The trace makes contact to a via positioned over holes in the transfer board and in the plate in which a SIP pin is positioned. A test probe, which makes contact with the test point location on the loaded circuit board, makes electrical contact to the pad on the transfer board and the test signal is transferred through the pad to the via by the trace and then to the SIP pin. The test signal is transmitted to the high force spring probes which makes electrical contact with the bottom of the SIP pin. The spring probes are electrically connected to an external electronic test analyzer to which the test signals are transmitted for analysis.

In an alternative embodiment, when a test probe is directly above a spring probe and they cannot be connected, there are two or more transfer boards and a spacer board positioned between the top transfer board and the bottom transfer board. One test probe makes electrical contact to a pad connected to a trace on the transfer board above a spring probe position. The trace makes contact to a via with a SIP pin pressed into it making electrical contact. The SIP pin passes through the spacer board and the bottom transfer boards. The spring probe makes electrical contact to the bottom of the SIP pins. In yet another alternative embodiment the transfer board includes vias for both the test probe and the SIP pin. In this embodiment the test probe makes electrical contact to a via connected to a trace on the transfer board. The trace makes contact to another via with a SIP pin pressed into it making electrical contact. The spring probe makes electrical contact to the bottom of the SIP pin.

Another improvement includes the use of newly designed low cost connection pins, wherein the connection pins include a swaged (SP) head and can have a piano wire construction which are utilized as replacements for SIP pins or 3070 personality pins. Currently available personality pins are a phos-bronze or BeCU construction generally square in profile, whereas piano wire is cheaper and stronger and eliminates the need for machining. Alternatively, the connection pins can include an etched or laser cut copper laminate notched portion to provide a connection along the side or shaft of the pin. The connection pins are hub-less pins which replace standard personality pins to reduce or eliminate resource conflicts on 3070 interface pins. For configurations in which connection pins are press fit into a via having a plurality of flaps or tabs, rotated drill apertures allow the tabs to fold when multiple layers are connected in sequence. For rework processes of the fixture, a spare or sister personality pin can be added from the bottom of the fixture to resolve resource conflicts or add ECO connections. Further, probe sockets can be incorporated into the fixture plate using the copper layers of the circuits as the electrical connection.

Another class of fixtures is wireless using a custom PWB (Printed Wiring Board) to make the connections between the interface and the test probes. The PWB is of standard design with flat pads in placed on component lands which are used to make contact with either double ended probes on the top side or soldered pins on the bottom (interface side). In this case the signal is conducted from the UUT through the double ended probe to the custom PWB. The signal then propagates along the internal traces of the PWB to a pad (SMD land) on the bottom side where a short pin is soldered in place. This pin makes contact with the tester interface.

These and other features and advantages of the present invention will be better understood with reference to the following detailed description and the accompanying drawings.

DETAILED DESCRIPTION

Figure 1:
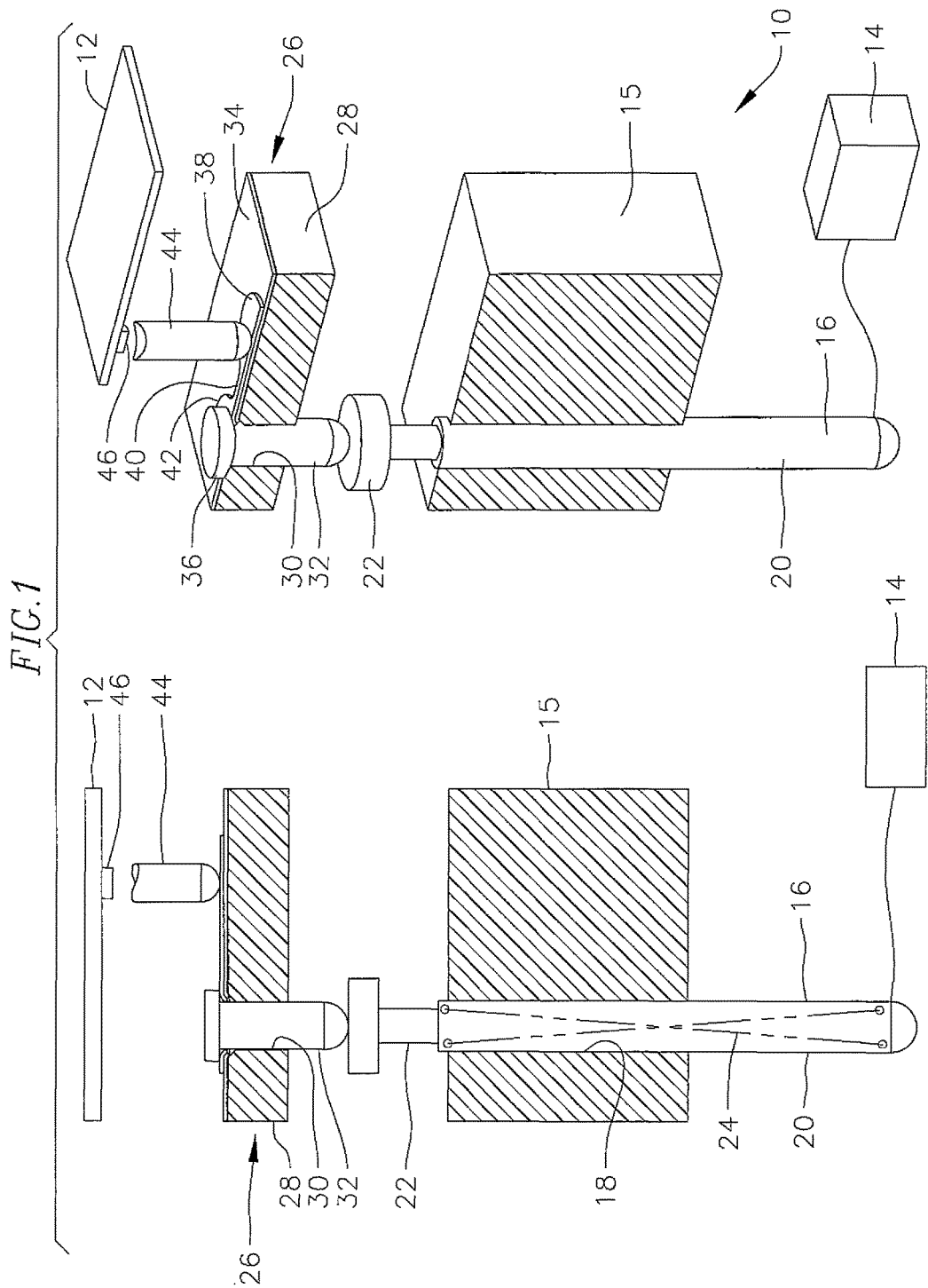
FIG. 1 is a fragmentary, schematic cross sectional view of a loaded board test fixture of the present invention.

FIG. 1 illustrates a loaded board test fixture 10 in accordance with the principals of the present invention. The test fixture is used to transmit test signals from a loaded printed circuit board 12 to an electronic test analyzer 14. The test fixture includes an interface probe plate 15 having a plurality of interface probes 16 positioned within holes 18 extending through the plate. For ease of illustration FIG. 1 depicts a single interface probe 16 positioned within a hole 18, however it is to be understood that plate 15 includes a plurality of interface probes 16 positioned within holes 18 in a uniform grid array across the plate 15. Interface probes 16 are electrically connected to external test analyzer 14. The interface probes are arranged in a hole pattern sufficiently far apart to accommodate spring probes, such as being spaced apart 100 mils on center. The 100 mil spring probes should be able to deliver a sufficient spring force in a range from about 4 to about 16 ounces. Typical 100 mil spring probes are made of beryllium cooper alloy and include an outer receptacle or barrel 20, a plunger 22 extending from the barrel, and a compression spring 24 positioned inside the barrel for applying a biasing force to the plunger which reciprocates out of the barrel under spring pressure in a well known manner.

The test fixture of the present invention further includes a wiring board 26 which includes a plate 28 having a plurality of holes 30 for the positioning of interface pins 32. Interface pin 32 is preferably a SIP pin. Positioned on plate 28 is a transfer board 34 also having a hole 36 for SIP pin 32. Plate 28 and transfer board 34 are made of a non-conductive material. A conductive pad 38 is positioned on the top surface of transfer board 34 and has a conductive trace 40 extending to a via 42 positioned in hole 36. A test probe 44 is positioned above pad 38 which contacts the pad on one end, and the test point location 46 on the unit under test 12 on the opposite end. The test probe 44 is retained in the fixture by a plate, latex sheet or other method known in the industry.

In the test fixture embodiment illustrated in FIG. 1 there is one transfer board 34. The test probe 44 makes electrical contact to pad 38 which is connected to trace 40 on the transfer board. The trace makes contact to via 42 with a SIP pin 32 pressed into it making electrical contact. The test signal goes from the test point location 46 on the printed circuit board 12 through test probe 38, to pad 34 and then to trace 40 and via 42 where it is transmitted to pin 32 and ultimately to interface probe 22 which makes contact with the end of SIP pin 32 before being transmitted to test analyzer 14. Again it is to be understood for ease of illustration FIG. 1 illustrates a single test point location and a single pad on transfer board 34, however transfer board 34 includes as many pads, traces connected to vias and SIP pins, and test probes as are required by the number of test point locations on the printed circuit board under test 12. Wiring board 26 permits the off grid transfer of test signals from the printed circuit board to an on-grid pattern of interface probes 16.

Figure 2:
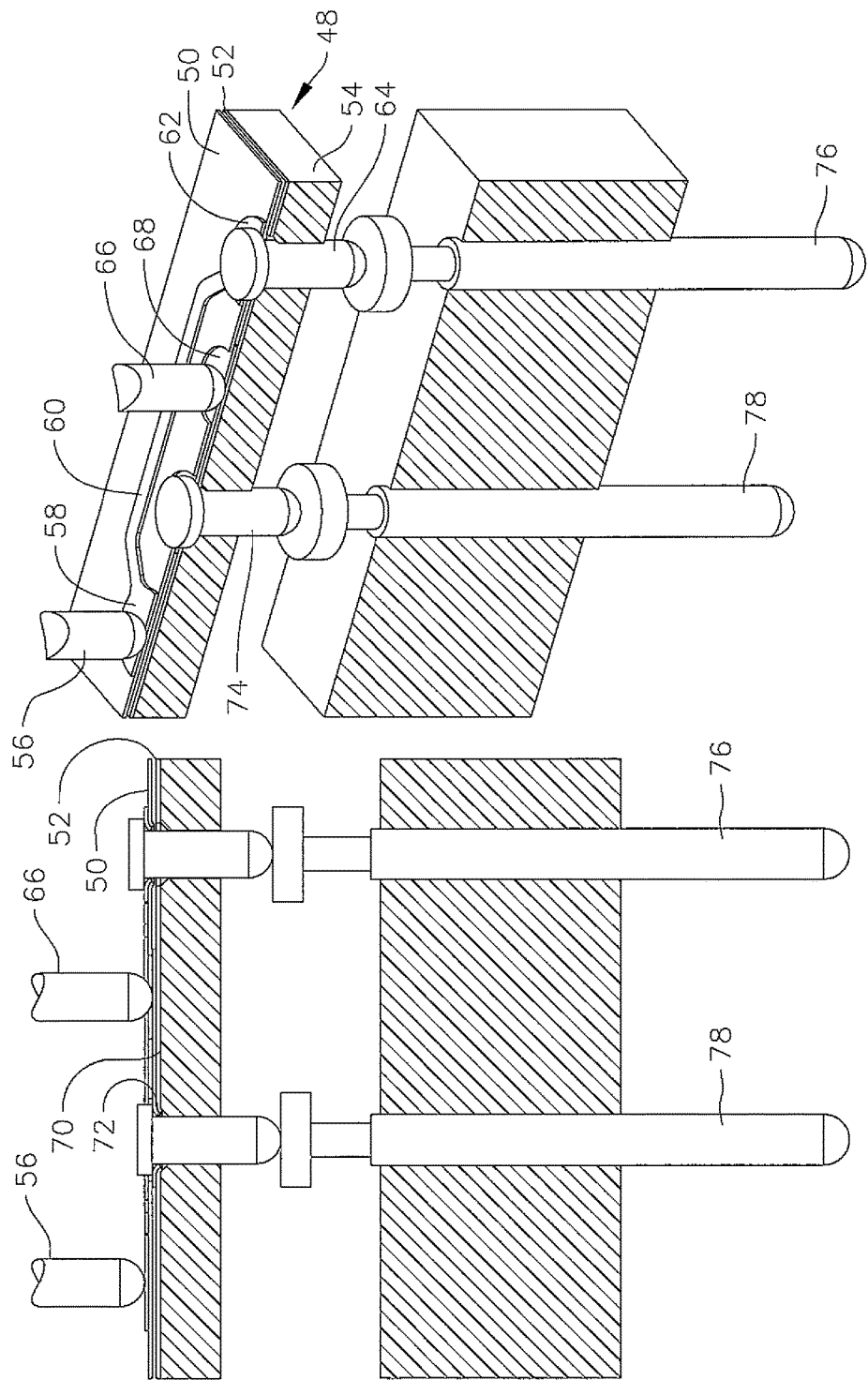
FIG. 2 is a fragmentary, schematic cross-sectional view of an alternative loaded board test fixture of the present invention.

FIG. 2 illustrates an alternative wiring board 48 having two transfer boards 50,52 positioned on plate 54. On transfer board 50 a test probe 56 makes electrical contact to a pad 58 connected to trace 60 which extends to via 62. A SIP pin 64 is pressed into via 62 making electrical contact. Test probe 66 makes electrical contact to pad 68 connected to trace 70 on transfer board 52. Trace 70 makes contact to via 72 having SIP pin 74 pressed into it making electrical contact. Interface probes 76 and 78 are in electrical contact with SIP pins 64 and 74 respectively. Transfer board 52 has holes for every SIP pin extending through the transfer board and transfer board 50 has holes for every SIP pin extending there through as well as holes for every test probe required to extend to pads located on transfer board 52. The wiring board 48 includes multiple transfer boards to accommodate test pad and trace locations for multiple test point locations on the unit under test without interfering with one another.

Figure 3:
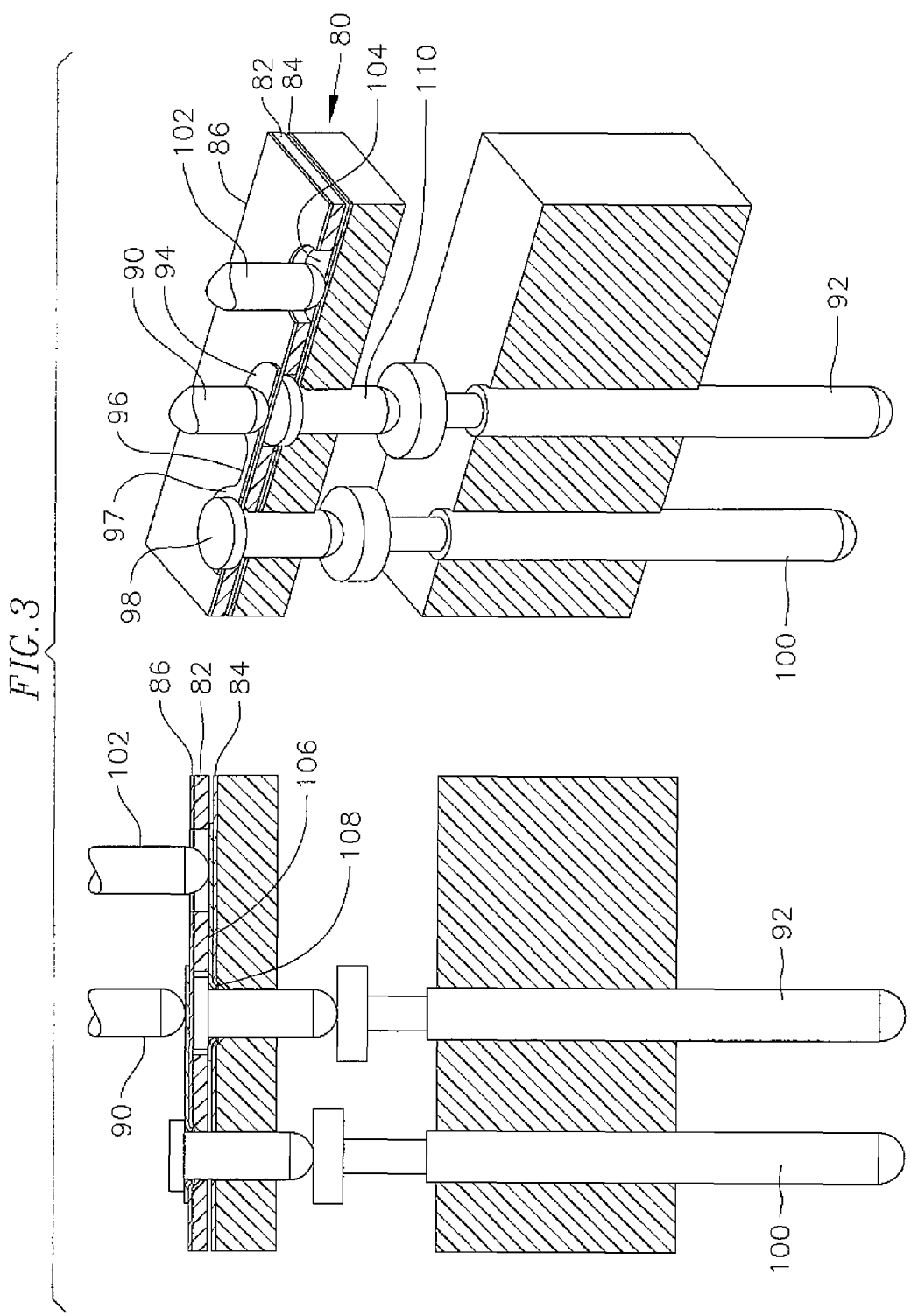
FIG. 3 is a fragmentary, schematic cross-sectional view of another alternative embodiment loaded board test fixture of the present invention.

FIG. 3 illustrates another alternative embodiment wiring board 80 which includes a spacer board 82 positioned in between transfer boards 84 and 86. The use of a spacer board between transfer boards 84 and 86 is necessary when a test probe 90, because of a test point location on the unit under test, is directly above an interface probe 92 and they cannot be electrically connected. Test probe 90 makes electrical contact to pad 94 connected to trace 96 which contacts via 97 and SIP pin 98. Pad 94 is positioned above interface probe 92. SIP pin 98 is pressed into via 97 which electrically communicates with interface probe 100. Test probe 102 makes electrical contact to pad 104 connected to trace 106 and via 108 having SIP pin 110 pressed into it. Interface probe 92 contacts SIP pin 110.

Figure 4:
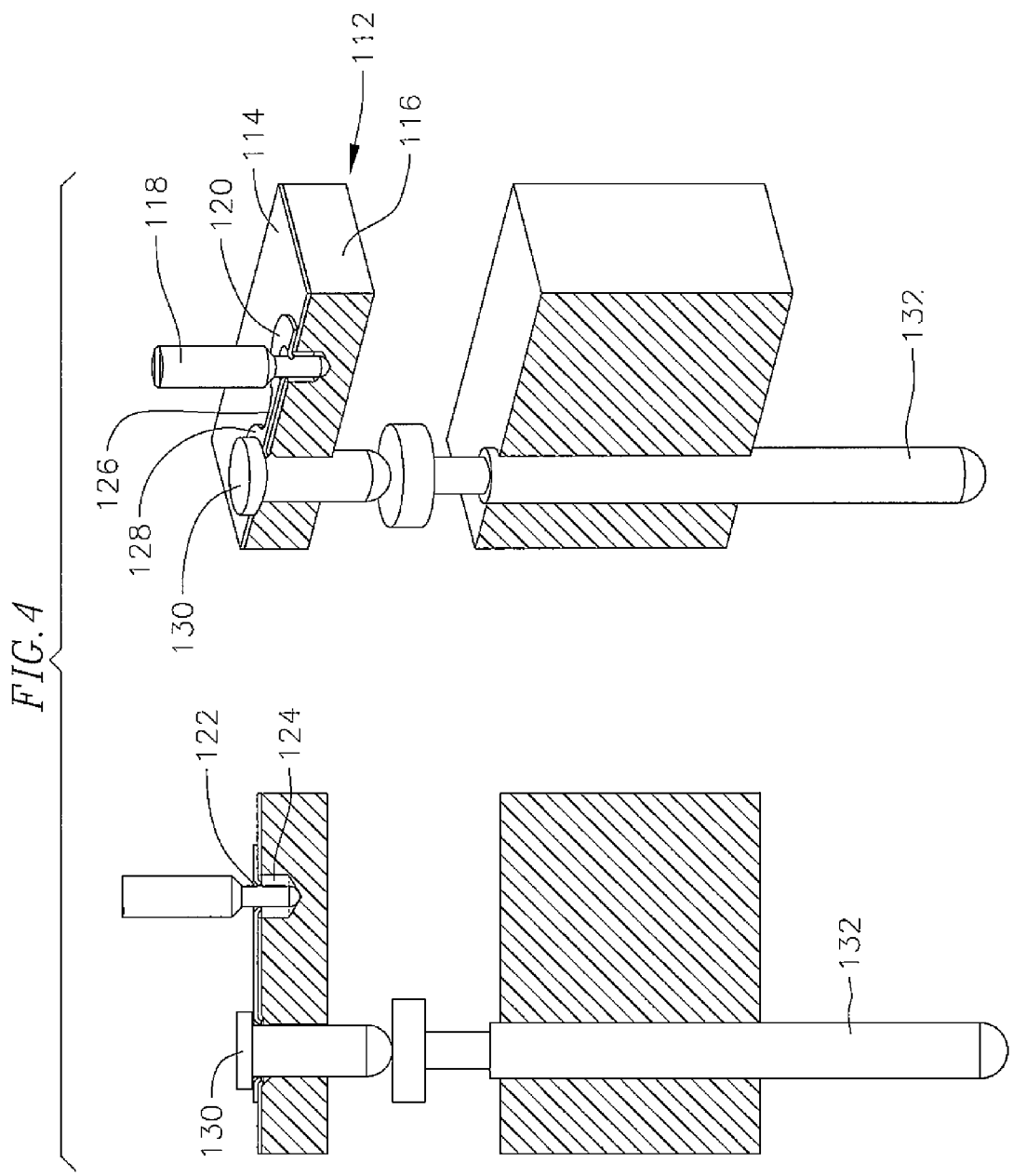
FIG. 4 is a fragmentary, schematic cross-sectional view of another alternative embodiment loaded board test fixture of the present invention.

FIG. 4 illustrates another alternative transfer board 112. In this embodiment there is one transfer board 114 positioned on plate 116. A test probe 118 makes electrical contact to a via positioned through a hole 122 in transfer board 114 which also extends into a cavity 124 in plate 116. Via 120 is connected to a trace 126 which makes contact with a second via 128 having a SIP pin 130 pressed into it. SIP pin 130 extends through holes in the transfer board and plate 116 to make contact with interface probe 132.

Figure 5:
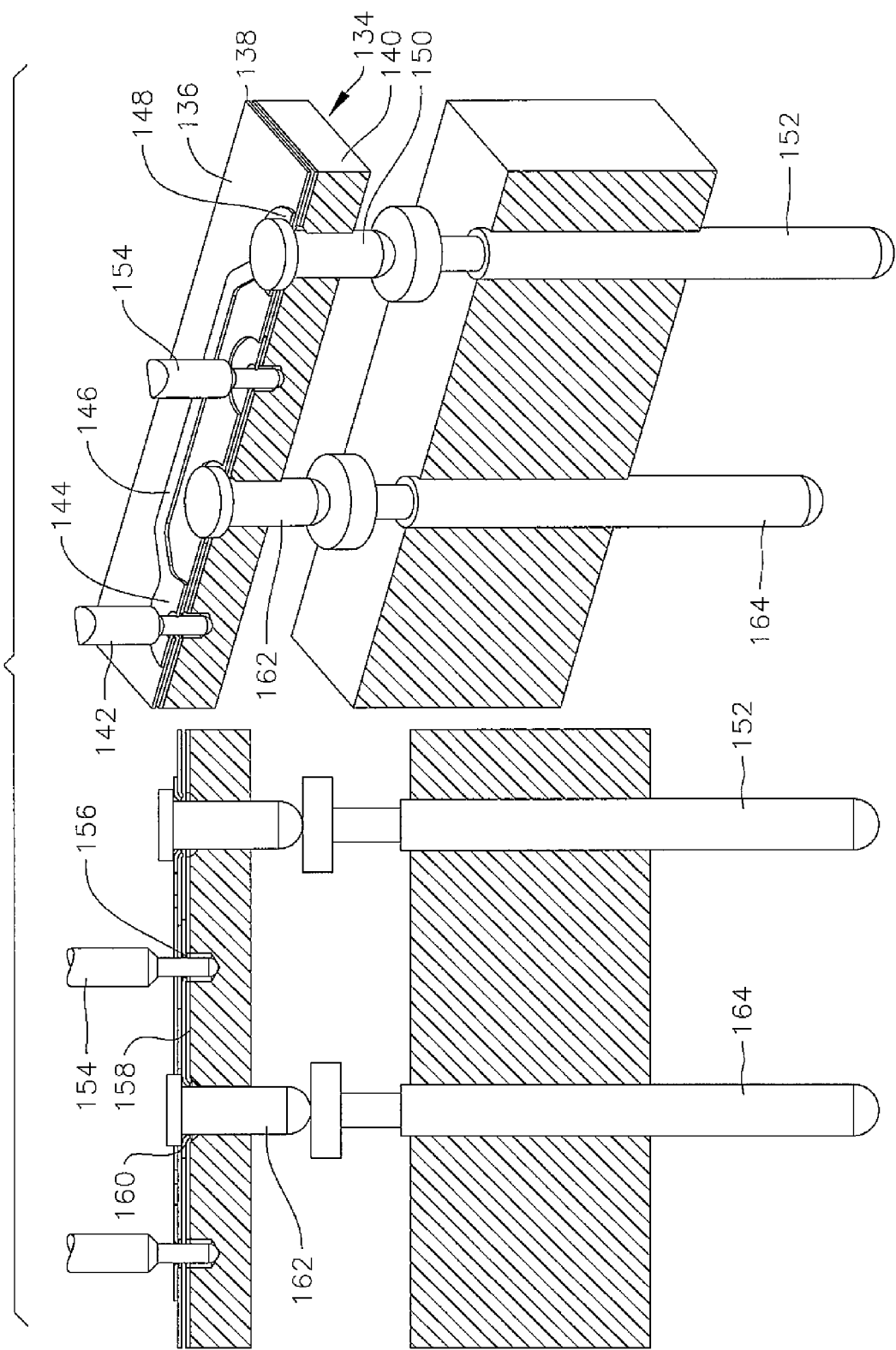
FIG. 5 is a fragmentary, schematic cross-sectional view of another alternative embodiment loaded board test fixture of the present invention.

FIG. 5 illustrates yet another alternative embodiment wiring board 134. In this embodiment there are multiple transfer boards 136 and 138 positioned on plate 140. On transfer board 136 test probe 142 makes electrical contact to via 144 connected to trace 146 which in turn makes contact to a second via 148 having a SIP pin 150 pressed into it. Interface probe 152 makes electrical contact to the bottom of SIP pin 150. Test probe 154 makes electrical contact to via 156 which is connected to trace 158 which extends to second via 160 having SIP pin 162 pressed into it. Interface probe 164 makes electrical contact to the bottom of SIP pin 162. Transfer board 136 has holes for each SIP pin extending there through as well as holes for each test probe making contact with a via on transfer board 138.

Figure 6:
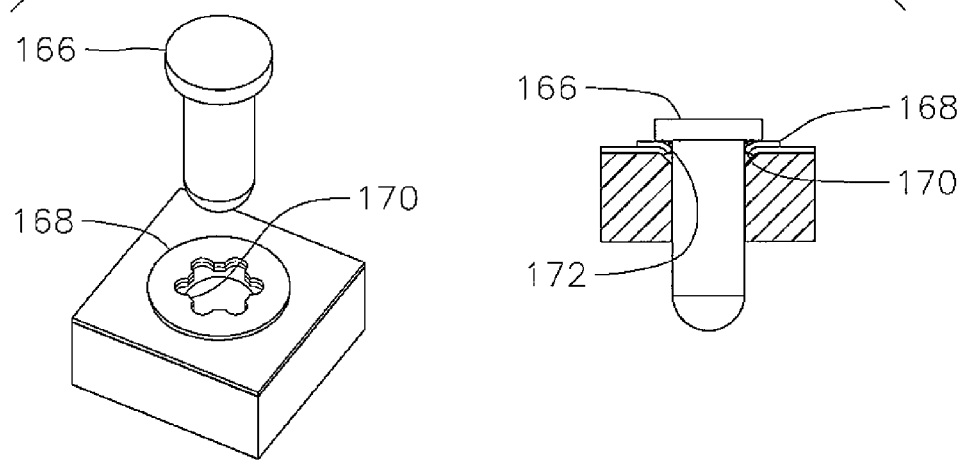
FIG. 6 is a detailed view of a SIP pin and trace connection of the test fixture of the present invention.
Figure 7:
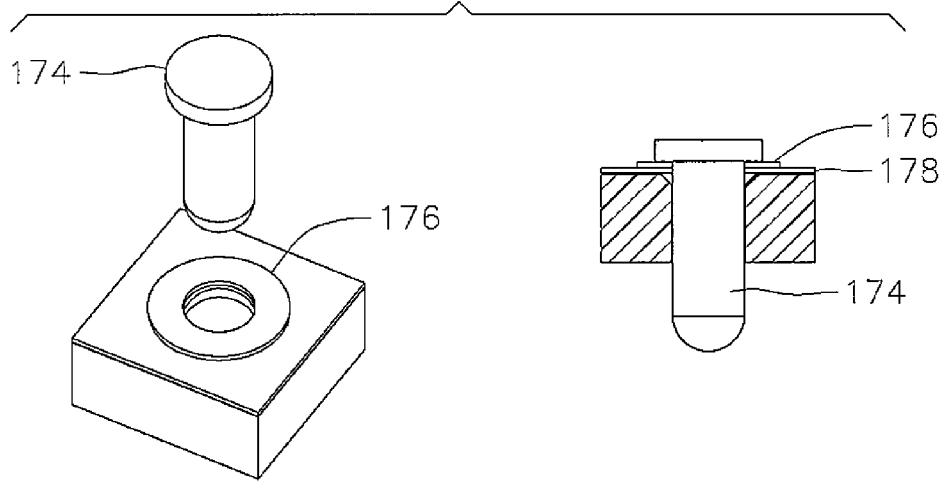
FIG. 7 is detailed view of an alternative SIP pin and trace connection of the present invention.
Figure 8:
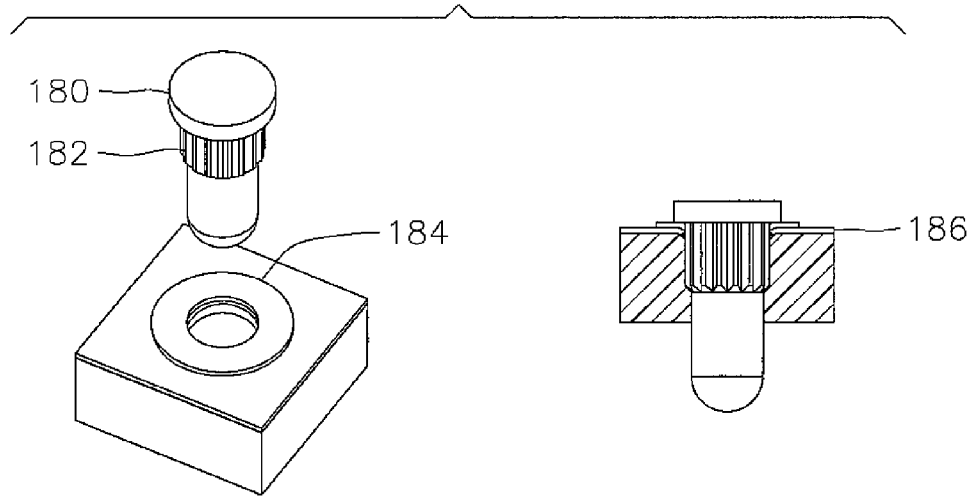
FIG. 8 is a detailed view of another alternative embodiment SIP pin and trace connection of the present invention.

FIGS. 6-8 illustrate the electrical connection between SIP pins and vias. FIG. 6 illustrates SIP pin 166 which is pressed into via 168 having a plurality of flaps 170 that make contact to the side 172 of SIP pin 166. Flaps 170 can be rotated to allow folding when multiple layers are connected in sequence. Rotation can be accomplished through rotated drill apertures. In FIG. 7 SIP pin 174 is pressed through via 176 and makes contact with trace 178. In FIG. 8, SIP pin 180 includes a knurled edge 182 which when pressed through via 184, the knurled edge makes electrical contact with trace 186.

Figure 9:
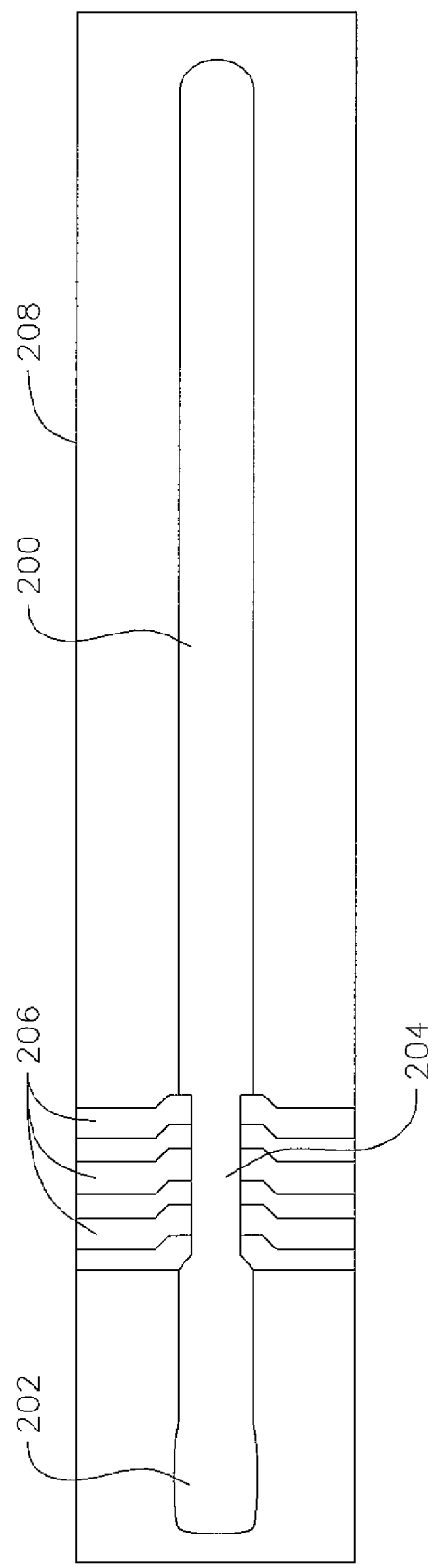
FIG. 9 is a side view of a connection pin of the loaded board test fixture of the present invention.

FIG. 9 illustrates a connection pin 200 having a swaged head 202 which is a low cost design which can be utilized in the test fixture of the present invention, Connection pin 200 can be manufactured from piano wire and would be substituted for the SIP pins or 3070 personality pins otherwise utilized. Connection pin 200 can have an etched or laser cut section 204 for connection to the vias positioned on the transfer boards. Alternatively, the etched or laser cut portions can make electrical contact with the copper laminated traces 206 extending through a transfer board 208. Connection pin 200 can also be a hub-less SIP pin or post to replace standard personality pins to reduce or eliminate resource conflicts on 3070 interfaces. In these instances connection pins 200 would be ideally 0.030-0.032 inches in diameter.

Figure 10:
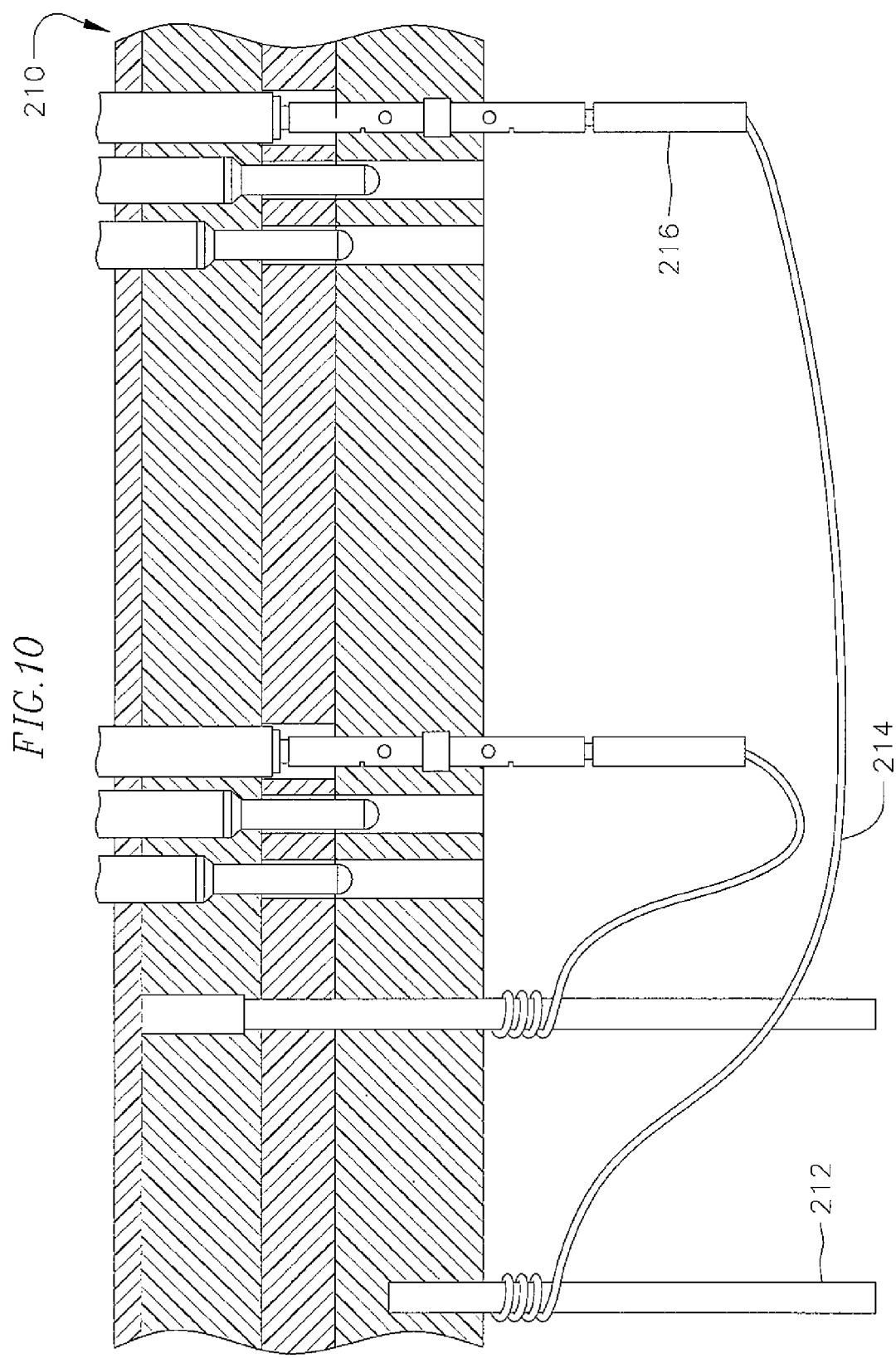
FIG. 10 is a fragmentary, schematic cross-sectional view of another alternative embodiment loaded board test fixture of the present invention.
Figure 11:
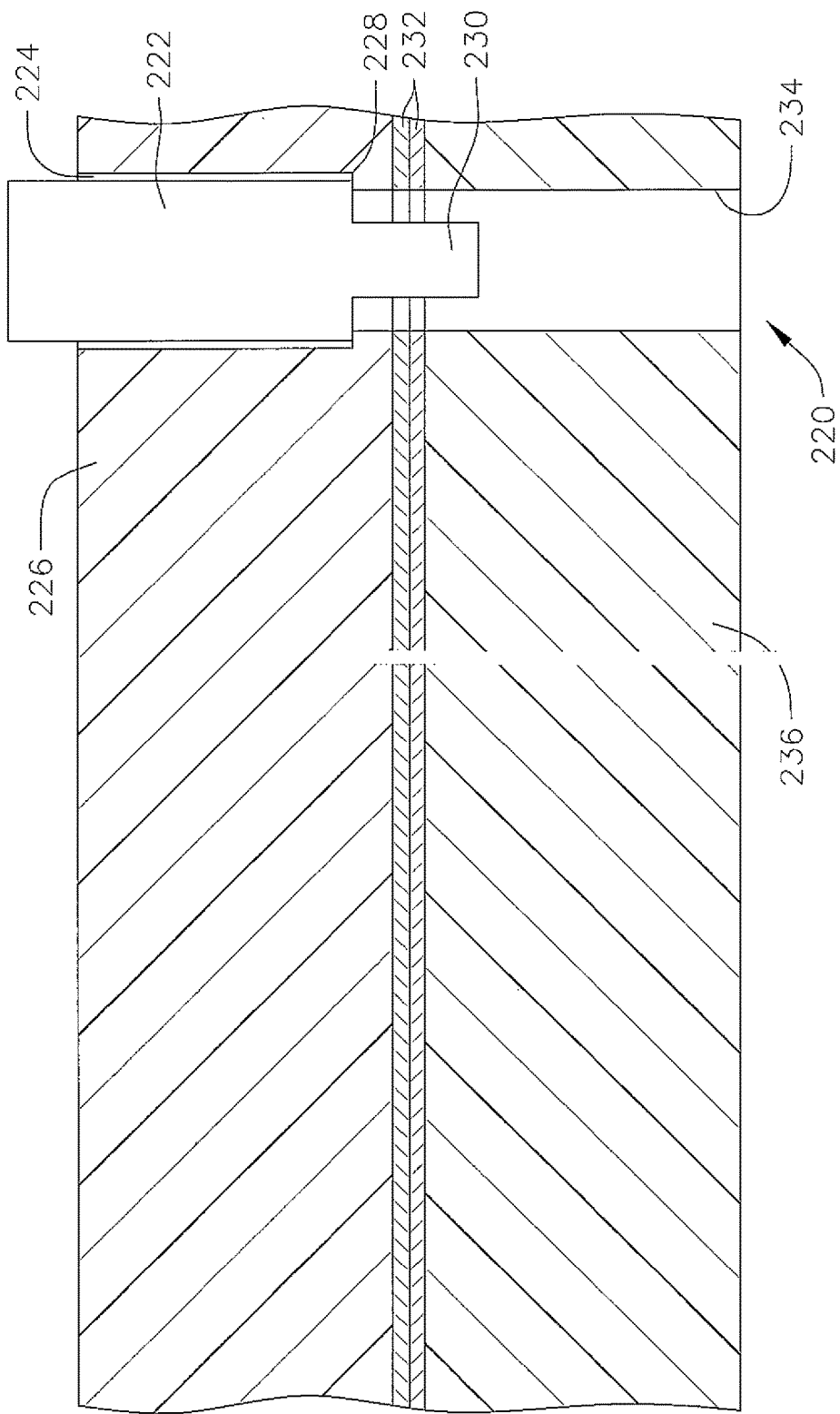
FIG. 11 is a fragmentary, schematic cross-sectional view of another alternative embodiment loaded board test fixture of the present invention.

As shown in FIG. 10, a fixture 210 can accommodate engineering change orders and undergo a rework process by adding a spare or personality pin 212 from the bottom of the fixture to resolve resource conflicts or to add ECO connections. Connection pin 212 would include a jump wire 214 to make an electrical connection with rework receptacle 216. FIG. 11 illustrates another embodiment fixture 220 which incorporates a probe socket 222 extending through a hole 224 in fixture plate 226. A shoulder 228 is positioned within hole 224 to control a probe height which would be positioned within receptacle 222. Probe socket 222 includes a tail portion 230 which extends through the copper circuit layers 232 for the electrical connection. Tail portion 230 extends into a hole 234 in a bottom plate 236.

Although the present invention has been illustrated with respect to several embodiments thereof, it is to be understood that the invention is not to be so limited since changes and modifications can be made therein which are within the full intended scope of the invention as hereinafter claimed.

What is claimed is:

1. A wiring board for transmission of test signals between test point locations on a circuit board under test and an external test analyzer comprising:
    a single non-conductive board having a conductive circuit layer positioned on a top surface, the conductive circuit layer having a conductive first pad without a hole in the single non-conductive board and a conductive trace extending to a conductive second pad positioned around a hole extending through the single non-conductive board for receipt of an interface pin extending through the single non-conductive board; and
    a compliant contact making electrical contact with the test point locations and the conductive first pad of the circuit layer.

2. The wiring board of claim 1, wherein there are multiple conductive circuits layered on top of one another on the single non-conductive board.

3. The wiring board of claim 2, wherein there is a compliant contact and an interface pin for each conductive circuit.

4. The wiring board of claim 1, wherein the conductive second pad is a via.

5. The wiring board of claim 4, wherein the interface pin extends through the via.

6. The wiring board of claim 4, wherein a short headless pin extends through the via for the sole purpose of connecting the conductive second pad on one layer to another layer.

7. The wiring board of claim 4, wherein the via has at least one flap around an opening which engages the interface pin.

8. The wiring board of claim 6, wherein vias on successive layers have at least one flap rotated with respect to adjacent layers.

9. The wiring board of claim 1, wherein the interface pin has a smooth round portion for contacting the conductive second pad at the middle or end of a trace.

10. The wiring board of claim 1, wherein the conductive second pad is a via.

11. The wiring board of claim 1, wherein the interface pin has a swaged or crimped feature for mechanical retention.

12. The wiring board of claim 1, wherein the interface pin is piano or music wire.

13. The wiring board of claim 1, further having a spare interface pin extending from a bottom of the wiring board which is wired to a rework receptacle.

14. The wiring board of claim 1, further having a replacement interface pin extending from a bottom of the wiring board which is wired to a short pin when an offset of the interface pin is too large to tilt or bend into a normal position.

15. The wiring board of claim 1, further comprising a probe socket extending through the non-conductive board for repair purposes or for the support of special purpose test probes.

16. The wiring board of claim 1, wherein height of the test probes are controlled by a depth of a counter bore in a top plate so that the height is set for optimal compression when testing solder mask defined (SMD) lands or component leads of varying heights.

\* \* \* \* \*